United States Patent
Kato et al.

(10) Patent No.: US 11,088,269 B2
(45) Date of Patent: Aug. 10, 2021

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Daimotsu Kato, Kawasaki (JP); Yosuke Kajiwara, Yokohama (JP); Akira Mukai, Kawasaki (JP); Aya Shindome, Yokohama (JP); Hiroshi Ono, Setagaya (JP); Masahiko Kuraguchi, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

(*) Notice: Subject to any disclaimer, the term of this patent is extended or adjusted under 35 U.S.C. 154(b) by 0 days.

(21) Appl. No.: 16/807,721

(22) Filed: Mar. 3, 2020

(65) Prior Publication Data
US 2020/0411675 A1   Dec. 31, 2020

(30) Foreign Application Priority Data
Jun. 28, 2019 (JP) ............................. JP2019-121890

(51) Int. Cl.
*H01L 29/778* (2006.01)
*H01L 29/423* (2006.01)
*H01L 29/20* (2006.01)

(52) U.S. Cl.
CPC ...... *H01L 29/7783* (2013.01); *H01L 29/2003* (2013.01); *H01L 29/4236* (2013.01); *H01L 29/7786* (2013.01); *H01L 29/7787* (2013.01)

(58) Field of Classification Search
CPC ................................................. H01L 29/7783
See application file for complete search history.

(56) References Cited

U.S. PATENT DOCUMENTS 8,674,407 B2   3/2014  Ando et al.
9,337,332 B2   5/2016  Chu et al.
(Continued)

FOREIGN PATENT DOCUMENTS

JP   2014-212340 A   11/2014
JP   2016-149404 A    8/2016
JP   2018-125440 A    8/2018

OTHER PUBLICATIONS

S Nakazawa, et al., "Fast Switching Performance by 20 A/730 V AlGaN/GaN MIS-HFET Using AlON Gate Insulator", IEDM2017-606, 25.1.2, 2017, 4 pages.

*Primary Examiner* — Grant S Withers
(74) *Attorney, Agent, or Firm* — Oblon, McClelland, Maier & Neustadt, L.L.P.

(57) ABSTRACT

According to one embodiment, a semiconductor device includes a first electrode, a second electrode, a third electrode, a first nitride region, a second nitride region, and a first insulating film. The first nitride region includes $Al_{x1}Ga_{1-x1}N$. The first nitride region includes first and second partial regions, a third partial region between the first and second partial regions, a fourth partial region between the first and third partial regions, and a fifth partial region between the third and second partial regions. The second nitride region includes $Al_{x2}Ga_{1-x2}N$. The second nitride region includes sixth and seventh partial regions. The first insulating film includes a first insulating region and is between the third partial region and the third electrode. The third partial region has a first surface opposing the first insulating region. The fourth partial region has a second surface opposing the sixth partial region.

16 Claims, 5 Drawing Sheets

(56) References Cited

U.S. PATENT DOCUMENTS

| | | | |
|---|---|---|---|
| 2015/0014817 A1* | 1/2015 | Hashimoto | H01L 29/205 257/615 |
| 2015/0311331 A1* | 10/2015 | Yamada | H01L 29/66462 257/76 |
| 2016/0225857 A1* | 8/2016 | Saito | H01L 29/513 |
| 2016/0233311 A1 | 8/2016 | Masumoto | |
| 2016/0282289 A1* | 9/2016 | Tanaka | H01L 29/207 |
| 2017/0092750 A1* | 3/2017 | Nagata | H01L 29/1095 |
| 2018/0219088 A1 | 8/2018 | Uesugi et al. | |
| 2020/0220003 A1* | 7/2020 | Kuraguchi | H01L 29/4236 |

* cited by examiner

SEMICONDUCTOR DEVICE

CROSS-REFERENCE TO RELATED APPLICATIONS

This application is based upon and claims the benefit of priority from Japanese Patent Application No. 2019-121890, filed on Jun. 28, 2019; the entire contents of which are incorporated herein by reference.

FIELD

Embodiments described herein relate generally to a semiconductor device.

BACKGROUND

For example, there is a semiconductor device that uses a nitride semiconductor. It is desirable to improve the characteristics of the semiconductor device.

DETAILED DESCRIPTION

According to one embodiment, a semiconductor device includes a first electrode, a second electrode, a third electrode, a first nitride region, a second nitride region, and a first insulating film. The first nitride region includes $Al_{x1}Ga_{1-x1}N$ ($0 \leq x1 < 1$). The first nitride region includes a first partial region, a second partial region, a third partial region between the first partial region and the second partial region, a fourth partial region between the first partial region and the third partial region, and a fifth partial region between the third partial region and the second partial region. A first direction from the first partial region toward the first electrode crosses a second direction from the first electrode toward the second electrode. A direction from the second partial region toward the second electrode is aligned with the first direction. The second nitride region includes $Al_{x2}Ga_{1-x2}N$ ($0 < x2 \leq 1$ and $x1 < x2$). The second nitride region includes a sixth partial region and a seventh partial region. A direction from the fourth partial region toward the sixth partial region is aligned with the first direction. A direction from the fifth partial region toward the seventh partial region is aligned with the first direction. A direction from the third partial region toward the third electrode is aligned with the first direction. At least a portion of the third electrode is between the sixth partial region and the seventh partial region in the second direction. The first insulating film includes a first insulating region. The first insulating region is between the third partial region and the third electrode in the first direction. The third partial region has a first surface opposing the first insulating region. The fourth partial region has a second surface opposing the sixth partial region. A ratio of a distance along the first direction between a position along the first direction of the first surface and a position along the first direction of the second surface to a length along the first direction of the sixth partial region is 2 or more. A stacked region including the third partial region and the first insulating region includes a first position and a second position. The first position is between the second position and the third electrode in the first direction. A concentration of Na in the stacked region has a peak at the first position. A concentration of Na at the second position is $1/100$ of a concentration of Na at the first position. A first distance along the first direction between the first position and the second position is 8 nm or less.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1A:
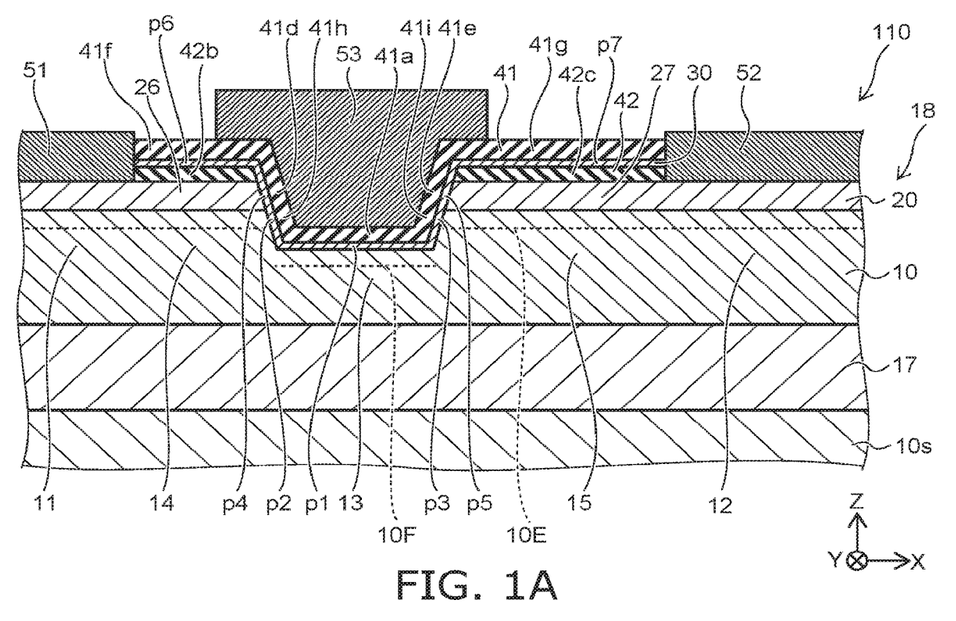
FIG. 1A and FIG. 1B are schematic cross-sectional views illustrating a semiconductor device according to a first embodiment.
Figure 1B:
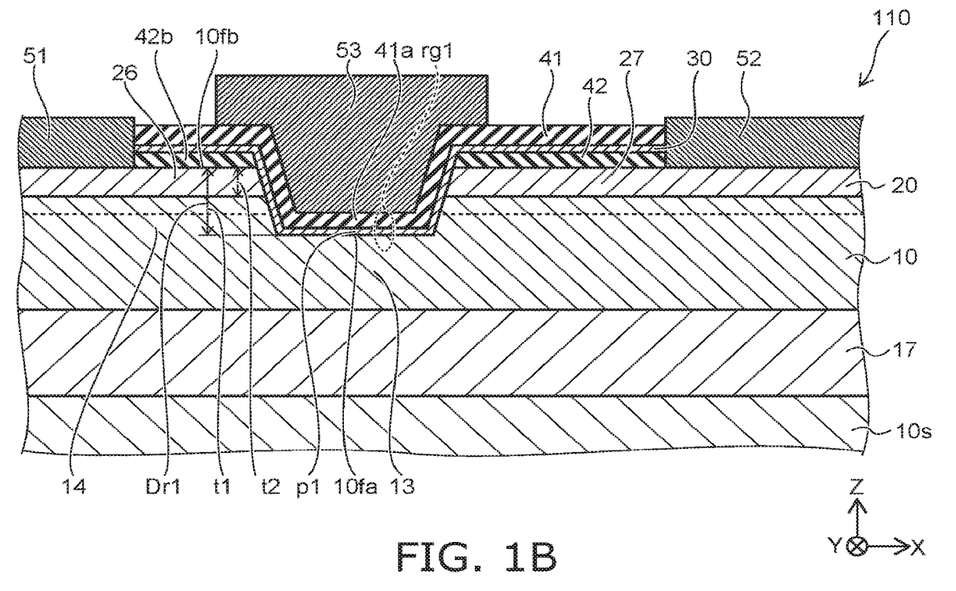

FIG. 1A and FIG. 1B are schematic cross-sectional views illustrating a semiconductor device according to a first embodiment.

As shown in FIG. 1A, the semiconductor device 110 according to the embodiment includes a first electrode 51, a second electrode 52, a third electrode 53, a first nitride region 10, a second nitride region 20, and a first insulating film 41. In the example, the semiconductor device 110 further includes a third nitride region 30 and a second insulating film 42.

The first nitride region 10 includes $Al_{x1}Ga_{1-x1}N$ ($0 \leq x1 < 1$). The composition ratio x1 of Al is, for example, not less than 0 and not more than 0.05. The first nitride region 10 includes, for example, GaN. The first nitride region 10 is, for example, a semiconductor region. The first nitride region 10 includes, for example, a crystal.

The first nitride region 10 includes, for example, first to fifth partial regions 11 to 15. The third partial region 13 is between the first partial region 11 and the second partial region 12. The fourth partial region 14 is between the first partial region 11 and the third partial region 13. The fifth partial region 15 is between the third partial region 13 and the second partial region 12. For example, the first to fifth partial regions 11 to 15 are continuous with each other.

A first direction from the first partial region 11 toward the first electrode 51 crosses a second direction from the first electrode 51 toward the second electrode 52.

The second direction is, for example, an X-axis direction. One direction perpendicular to the X-axis direction is taken as a Z-axis direction. A direction perpendicular to the X-axis direction and the Z-axis direction is taken as a Y-axis direction.

The first direction is, for example, the Z-axis direction.

The direction from the second partial region 12 toward the second electrode 52 is aligned with the first direction (e.g., the Z-axis direction).

The second nitride region 20 includes $Al_{x2}Ga_{1-x2}N$ ($0<x2\leq 1$ and $x1<x2$). The second nitride region 20 includes AlGaN. For example, the composition ratio x2 of Al is not less than 0.1 and not more than 0.3. In one example, the second nitride region 20 includes, for example, $Al_{0.2}Ga_{0.8}N$. The second nitride region 20 is, for example, a semiconductor region. The second nitride region 20 includes, for example, a crystal.

The second nitride region 20 includes a sixth partial region 26 and a seventh partial region 27. The direction from the fourth partial region 14 toward the sixth partial region 26 is aligned with the first direction (e.g., the Z-axis direction). The direction from the fifth partial region 15 toward the seventh partial region 27 is aligned with the first direction.

The direction from the third partial region 13 toward the third electrode 53 is aligned with the first direction (e.g., the Z-axis direction). At least a portion of the third electrode 53 is between the sixth partial region 26 and the seventh partial region 27 in the second direction (the X-axis direction).

The first insulating film 41 includes a first insulating region 41a. The first insulating region 41a is between the third partial region 13 and the third electrode 53 in the first direction (the Z-axis direction).

The third nitride region 30 includes $Al_{x3}Ga_{1-x3}N$ ($0<x3\leq 1$ and $x1<x3$). For example, the composition ratio x3 of Al in the third nitride region 30 is higher than the composition ratio x2 of Al in the second nitride region 20. In one example, the composition ratio x3 of Al is, for example, not less than 0.8 and not more than 1. For example, the third nitride region 30 includes, for example, AlN. The third nitride region 30 is, for example, a semiconductor region. As described below, the crystallinity of the third nitride region 30 may be different by location.

The third nitride region 30 includes first to seventh portions p1 to p7. The first portion p1 is between the first insulating region 41a and the third partial region 13 in the Z-axis direction. The second portion p2 is between the third electrode 53 and the fourth partial region 14 in the X-axis direction. The third portion p3 is between the third electrode 53 and the fifth partial region 15 in the X-axis direction. The fourth portion p4 is between the third electrode 53 and the sixth partial region 26 in the X-axis direction. The fifth portion p5 is between the third electrode 53 and the seventh partial region 27 in the X-axis direction.

The sixth partial region 26 is between the sixth portion p6 and the fourth partial region 14 in the Z-axis direction. The seventh partial region 27 is between the seventh portion p7 and the fifth partial region 15 in the Z-axis direction. For example, the first to seventh portions p1 to p7 are continuous with each other.

The second insulating film 42 includes a second insulating region 42b and a third insulating region 42c. The sixth partial region 26 is between the fourth partial region 14 and the second insulating region 42b. The second insulating region 42b is between the sixth partial region 26 and the sixth portion p6. The seventh partial region 27 is between the fifth partial region 15 and the third insulating region 42c. The third insulating region 42c is between the seventh partial region 27 and the seventh portion p7.

The first insulating film 41 further includes fourth to seventh insulating regions 41d to 41g. The fourth insulating region 41d is between the fourth portion p4 and the third electrode 53. The fifth insulating region 41e is between the fifth portion p5 and the third electrode 53. The sixth portion p6 is between the sixth insulating region 41f and the second insulating region 42b. The seventh portion p7 is between the seventh insulating region 41g and the third insulating region 42c.

The first insulating film 41 may further include an eighth insulating region 41h and a ninth insulating region 41i. The eighth insulating region 41h is between the second portion p2 and the third electrode 53 in the X-axis direction. The ninth insulating region 41i is between the third portion p3 and the third electrode 53 in the X-axis direction. The fourth to ninth insulating regions 41d to 41i are continuous with each other.

For example, the first insulating film 41 includes silicon and oxygen. For example, the first insulating film 41 may include Na, silicon and oxygen. For example, the second insulating film 42 includes silicon and nitrogen. For example, the first insulating film 41 does not include nitrogen. Or, the concentration of nitrogen included in the first insulating film 41 is lower than the concentration of nitrogen included in the second insulating film 42. The first insulating film 41 includes, for example, $SiO_2$. The second insulating film 42 includes, for example, SiN.

For example, the first nitride region 10 and the second nitride region 20 are included in a stacked body 18. For example, the stacked body 18 is provided on a base body 10s. For example, a buffer layer 17 is formed on the base body 10s. The first nitride region 10 is epitaxially grown on the buffer layer 17. The second nitride region 20 is epitaxially grown on the first nitride region 10. The second insulating film 42 is formed on the second nitride region 20. The stacked body 18 may include the second insulating film 42. For example, a recess (a recess or a trench) is formed by removing a portion of the stacked body 18 via an opening in the second insulating film 42. The bottom portion of the recess is positioned in the first nitride region 10. The third nitride region 30 is provided at the bottom surface of the recess (a portion of the first nitride region 10), the side surface of the recess (a portion of the first nitride region 10 and a portion of the second nitride region 20), and the front surface (e.g., the upper surface) of the stacked body 18. For example, at least a portion of the third nitride region 30 is epitaxially grown. The third nitride region 30 is, for example, a regrowth layer. The first insulating film 41 is formed after forming the third nitride region 30. For example, the first to third electrodes 51 to 53 are formed. The semiconductor device 110 is obtained thereby.

For example, the first electrode 51 functions as a source electrode. For example, the second electrode 52 functions as a drain electrode. For example, the third electrode 53 functions as a gate electrode. For example, the second insulating film 42 functions as a gate insulating film. For example, the second insulating film 42 functions as a protective film. For example, the current (the drain current) that flows between the first electrode 51 and the second electrode 52 can be controlled by the potential of the third electrode 53 (e.g., the gate voltage). The gate voltage is, for example, the potential of the third electrode 53 referenced to the potential of the first electrode 51.

For example, a two-dimensional electron gas 10E is generated at, for example, the portion of the first nitride region 10 at the second nitride region 20 side. The two-dimensional electron gas 10E is used as a carrier region. The semiconductor device 110 is, for example, a HEMT (High Electron Mobility Transistor).

In the semiconductor device 110 according to the embodiment, the first portion p1 of the third nitride region 30 is provided between the third electrode 53 and the first partial region 11. For example, a two-dimensional electron gas 10F is formed at the portion of the first partial region 11 at the first portion p1 side. Thereby, for example, high mobility is obtained.

As shown in FIG. 1B, the third partial region 13 has a first surface 10fa. The first surface 10fa opposes the first insulating region 41a. For example, the first surface 10fa opposes the first portion p1. The fourth partial region 14 has a second surface 10fb opposing the sixth partial region 26. The distance along the first direction between the position along the first direction (the Z-axis direction) of the first surface 10fa and the position along the first direction of the second surface 10fb is taken as a distance t1. The length along the first direction of the sixth partial region 26 is taken as a length t2. The length t2 corresponds to the thickness of the sixth partial region 26. The distance t1 corresponds to a recess depth Dr1. The ratio (t1/t2) of the distance t1 to the length t2 is taken as a ratio R1. The first nitride region 10 is not removed when the ratio R1 is 1. When the ratio R1 is 2, the removal depth of the first nitride region 10 is equal to the thickness of the second nitride region 20 (the length t2).

In the embodiment, the recess depth Dr1 is set to be deeper than a general depth. In the embodiment, the ratio R1 is 2 or more. The ratio R1 may be 3 or more. The ratio R1 may be 3.5 or more. As described below, high mobility is obtained.

By experiments of the inventor, it was found that high mobility is obtained by setting the recess depth Dr1 to be deep (setting the ratio R1 to be high). The experiment results will now be described.

In the samples of the experiment, the first nitride region 10 is GaN. The second nitride region 20 is $Al_{0.2}Ga_{0.8}N$. The thickness (the length in the Z-axis direction) of the second nitride region 20 is 30 nm. The thickness (the length t2) of the sixth partial region 26 is 30 nm. The third nitride region 30 is AlN. The thickness of the third nitride region 30 (e.g., the length in the Z-axis direction of the first portion p1) is 3 nm. The second insulating film 42 is SiN. The thickness (the length in the Z-axis direction) of the second insulating film 42 is 10 nm. The first insulating film 41 is $SiO_2$. The thickness of the first insulating film 41 (e.g., the length in the Z-axis direction of the first insulating region 41a) is 30 nm. The first to third electrodes 51 to 53 include TiN.

Multiple samples are made in which the recess depth Dr1 is modified, and the ratio R1 is modified. The recess is formed by RIE (Reactive Ion Etching) using a gas including $BCl_4$. In the experiment, the recess depth Dr1 (the ratio R1) is modified by modifying the formation time of the recess. After the formation of the recess, the elements (B, Cl, etc.) that are included in the etching gas are removed by performing heat treatment in an atmosphere including ammonia gas. Subsequently, the third nitride region 30 and the first insulating film 41 are formed; and after heat treatment, the first to third electrodes 51 to 53 are formed. The samples of the semiconductor device are obtained thereby. The processing time of the formation of the recess is long for samples in which the recess depth Dr1 is deep (the ratio R1 is high). The mobility is evaluated for these samples.

Figure 2:
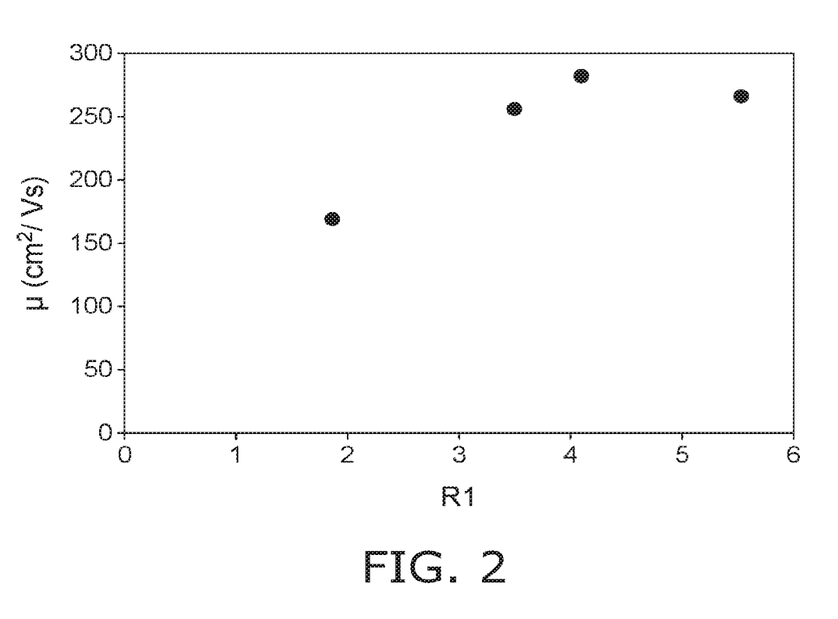
FIG. 2 is a graph illustrating a characteristic of the semiconductor device.

FIG. 2 is a graph illustrating a characteristic of the semiconductor device.

The horizontal axis of FIG. 2 is the ratio R1 (nm; the depth of the recess). The vertical axis of FIG. 2 is a mobility μ ($cm^2$/Vs; the electric field mobility). For the sample in which the ratio R1 is 1.86, the recess depth Dr1 is 56 nm. For the sample in which the ratio R1 is 3.5, the recess depth Dr1 is 105 nm. For the sample in which the ratio R1 is 4.1, the recess depth Dr1 is 123 nm. For the sample in which the ratio R1 is 5.53, the recess depth Dr1 is 166 nm.

It can be seen from FIG. 2 that the mobility μ is low when the ratio R1 is low and the recess is shallow. The mobility p is high when the recess is deep and the ratio R1 is high such as 3.5 or more.

It is considered that there is a relationship between the mobility μ and the ease of the movement of carriers in the carrier region (e.g., the two-dimensional electron gas 10E and the two-dimensional electron gas 10F). It is considered that when forming the recess, the crystal quality becomes low and the mobility μ becomes low due to the impurities, etc., introduced to the bottom portion of the recess (the third partial region 13). According to this concept, it is natural to consider that a shallow recess would be favorable to suppress the introduction of the impurities due to the formation of the recess.

However, according to the experiment results shown in FIG. 2, it was found that a high mobility μ is obtained when the recess is deep and the ratio R1 is high. Analysis of the samples relating to such new knowledge is performed.

Figure 3:
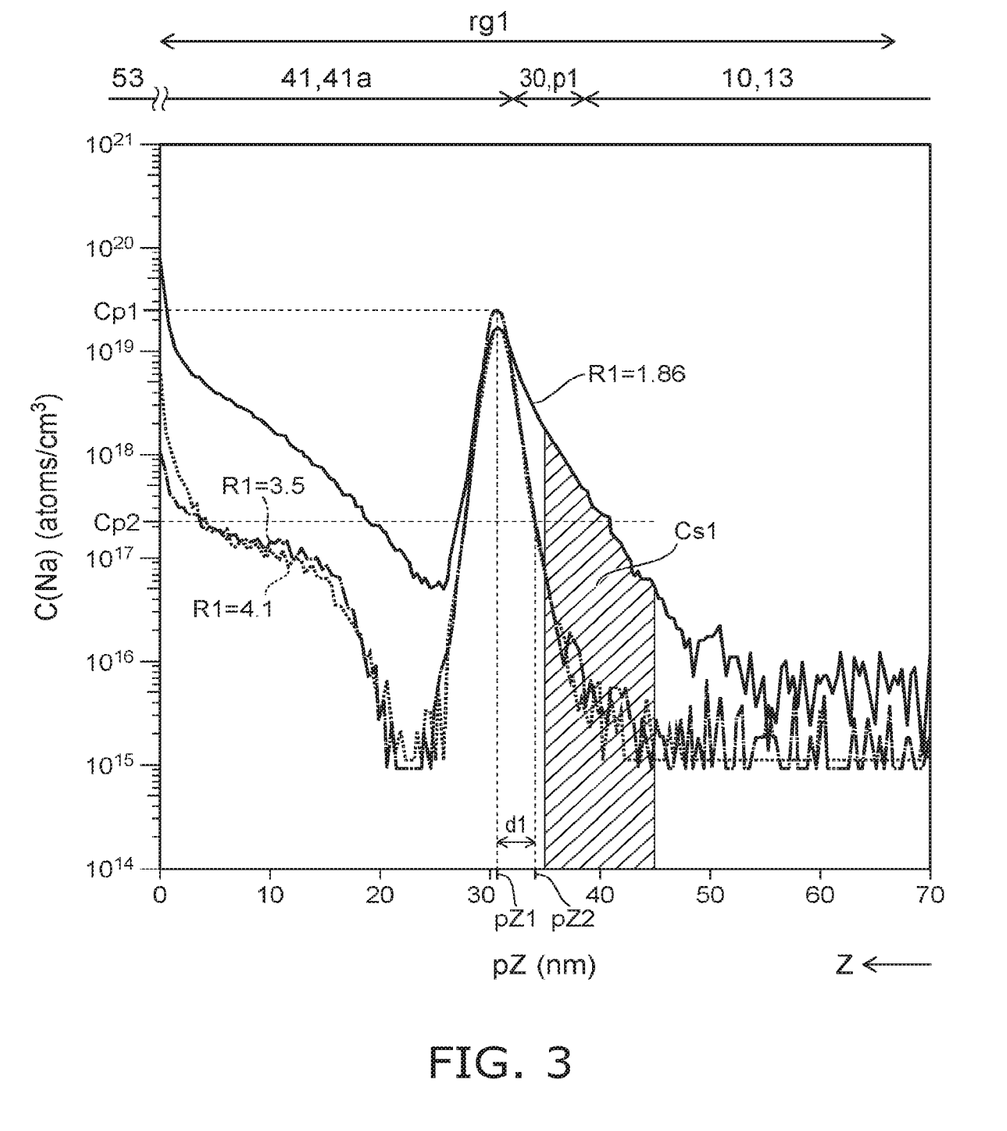
FIG. 3 is a graph illustrating SIMS analysis results of the semiconductor device.

FIG. 3 is a graph illustrating SIMS analysis results of the semiconductor device.

FIG. 3 shows the SIMS analysis results of a stacked region rg1 including the third partial region 13 and the first insulating region 41a (referring to FIG. 1B). The horizontal axis of FIG. 3 is a position pZ (nm) along the Z-axis direction. The vertical axis is a concentration C(Na) of Na (atoms/$cm^3$). The results of the samples in which the ratio R1 is 1.86, 3.5, or 4.1 are illustrated in FIG. 3.

It can be seen from FIG. 3 that the peak value of the concentration C(Na) of Na is substantially the same when the ratio R1 is any of 1.86, 3.5, or 4.1. However, the characteristic relating to the decrease of the concentration C(Na) of Na is different according to the ratio R1. The concentration C(Na) of Na does not decrease easily when the ratio R1 is 1.86. Conversely, the concentration C(Na) of Na decreases steeply when the ratio R1 is 3.5 or 4.1.

For example, the stacked region rg1 which includes the third partial region 13 and the first insulating region 41a includes a first position pZ1. The concentration of Na in the stacked region rg1 has a peak at the first position pZ1. The position in the Z-axis direction of the first position pZ1 is substantially the same (the position pZ=31 nm) when the ratio R1 is any of 1.86, 3.5, or 4.1.

In the range from the position of the first position pZ1+4 nm to the position of the first position pZ1+14 nm (the range of pZ=35 to 45 nm), the integral of the concentration C(Na) of Na (the surface area of a diagonal-line portion Cs1 of FIG. 3) is taken as a parameter C1(Na). A small parameter C1(Na) corresponds to a low amount of Na in this region.

Figure 4:
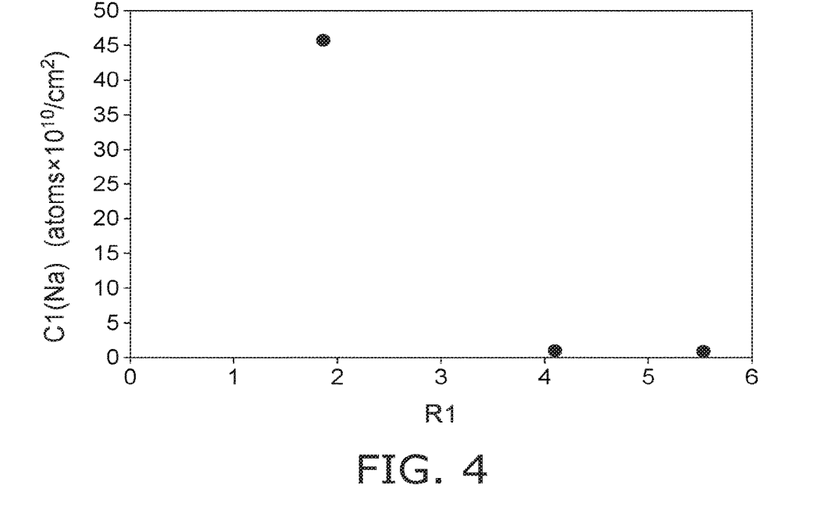
FIG. 4 is a graph illustrating a characteristic of the semiconductor device.

FIG. 4 is a graph illustrating a characteristic of the semiconductor device.

The horizontal axis of FIG. 4 is the ratio R1. The vertical axis is the parameter C1(Na) (atoms×$10^{10}$/$cm^2$). It can be seen from FIG. 4 that the parameter C1(Na) is high when the ratio R1 is 1.86. Conversely, the parameter C1(Na) is markedly low when the ratio R1 is 3.5 or 4.1. Thus, it was found that when the ratio R1 is high, the parameter C1(Na) is small and the amount of Na decreases markedly.

For example, when forming the recess, first, the second nitride region 20 is removed; subsequently, the removal of the first nitride region 10 starts. The composition ratio x2 of Al in the second nitride region 20 is higher than the composition ratio x1 of Al in the first nitride region 10. The etching rate is low when the composition ratio of Al is high. The etching rate of the second nitride region 20 (e.g., AlGaN) is lower than the etching rate of the first nitride region 10 (e.g., GaN). For example, a long etching time is necessary to remove the second nitride region 20. It is considered that the first nitride region 10 (GaN) is damaged during the long etching time. It is considered that the GaN is removed in a state of not being damaged easily when the etching of the second nitride region 20 (e.g., AlGaN) ends and the etching of the first nitride region 10 (GaN) starts.

It is considered that the damaged first nitride region 10 (GaN) remains easily in the case where the recess is shallow and the ratio R1 is low. Conversely, it is considered that in the case where the recess is deep and the ratio R1 is high, the damaged first nitride region 10 (GaN) also is removed; and damage of the remaining GaN is suppressed. It is considered that Na is trapped easily in damage such as that recited above. For example, it is considered that Na originates in impurities in the source gases, impurities adhered to the apparatus, impurities included in the surrounding environment, etc.

For example, it is considered that a phenomenon such as that illustrated in FIG. 4 occurs due to a mechanism such as that recited above. Thus, when the recess is deep and the ratio R1 is high, the damage is suppressed; for example, the amount of Na at the bottom portion of the recess is low. Thereby, as described in reference to FIG. 2, it is considered that a high mobility μ is obtained when the ratio R1 is high.

The embodiment is based on newly-discovered knowledge such as that recited above. Namely, the ratio R1 is set to be high. Also, the concentration of Na is caused to decrease steeply. For example, as shown in FIG. 3, compared to when the ratio R1 is low, the thickness to where the concentration C(Na) of Na becomes 1/100 of the peak value is thinner when the ratio R1 is high.

As shown in FIG. 3, for example, the stacked region rg1 which includes the third partial region 13 and the first insulating region 41a (referring to FIG. 1B) includes the first position pZ1 and a second position pZ2. The first position pZ1 is between the second position pZ2 and the third electrode 53 in the first direction (the Z-axis direction). For example, the first position pZ1 is between the second position pZ2 and the first insulating region 41a in the first direction (the Z-axis direction).

The concentration of Na in the stacked region rg1 has a peak at the first position pZ1. The concentration (the peak concentration) of Na at the first position pZ1 is taken as a first concentration Cp1. The concentration of Na at the second position pZ2 is taken as a second concentration Cp2. The second concentration Cp2 is 1/100 of the concentration (the first concentration Cp1) of Na at the first position pZ1. The second position pZ2 is the position where the Na concentration C(Na) becomes 1/100 of the peak concentration.

In the embodiment, a first distance d1 along the first direction (the Z-axis direction) between the first position pZ1 and the second position pZ2 is 8 nm or less. Thus, in the embodiment, the concentration of Na decreases steeply. Thereby, for example, a high mobility μ is obtained. According to the embodiment, a semiconductor device can be provided in which the characteristics can be improved.

In the embodiment, the first distance d1 may be 5 nm or less. The amount of Na can be reduced further.

In the embodiment, it is favorable for the parameter C1(Na) recited above (referring to FIG. 4) to be $10\times10^{10}/$cm$^2$ or less. The parameter C1(Na) may be $5\times10^{10}/$cm$^2$ or less. By setting the amount of Na to be low, for example, a high mobility μ is obtained.

In the embodiment, the third nitride region 30 includes, in addition to the first portion p1 on the third partial region 13 (e.g., GaN), the side surface portions of the recess (e.g., the second to fifth portions p2 to p5) and the portions (the sixth portion p6 and the seventh portion p7) on the second nitride region 20. These portions are continuous. By providing such a third nitride region 30, for example, good crystallinity of the first portion p1 is obtained easily. Thereby, for example, the two-dimensional electron gas 10F can be formed stably. A higher mobility is obtained stably thereby. According to the embodiment, a semiconductor device can be provided in which the characteristics can be improved stably.

The second insulating film 42 is provided in the embodiment. The upper surface of the second nitride region 20 is protected by the second insulating film 42 when forming the recess. The degradation of the second nitride region 20 can be suppressed.

In the embodiment, the first portion p1 of the third nitride region 30 is provided on the third partial region 13 of the first nitride region 10. Thereby, for example, good crystallinity of the first portion p1 is obtained easily.

On the other hand, the sixth portion p6 of the third nitride region 30 is provided on the second insulating region 42b of the second insulating film 42. The seventh portion p7 of the third nitride region 30 is provided on the third insulating region 42c of the second insulating film 42. Thus, the foundation is different between the first portion p1 and the sixth portion p6. The foundation is different between the first portion p1 and the seventh portion p7. Therefore, the crystallinity, etc., may be different between these portions.

For example, the crystallinity of the first portion p1 is higher than the crystallinity of the sixth portion p6. The crystallinity of the first portion p1 is higher than the crystallinity of the seventh portion p7. By setting the crystallinity of the first portion p1 to be high, for example, high mobility is obtained easily.

For example, at least a portion of the first portion p1 includes a crystal. At least a portion of the sixth portion p6 may be amorphous. At least a portion of the seventh portion p7 may be amorphous.

The side surface portion (e.g., the second portion p2) of the third nitride region 30 is formed on a nitride semiconductor. Therefore, the crystallinity of the side surface portion is relatively high. For example, the crystallinity of the second portion p2 is higher than the crystallinity of the sixth portion p6. For example, the crystallinity of the third portion p3 is higher than the crystallinity of the seventh portion p7.

The fourth portion p4 is formed on a nitride semiconductor. Therefore, the crystallinity of the fourth portion p4 is relatively high. For example, the crystallinity of the fourth portion p4 is higher than the crystallinity of the sixth portion p6. For example, the crystallinity of the fifth portion p5 is higher than the crystallinity of the seventh portion p7.

In the embodiment, in the X-axis direction, the third electrode 53 opposes a portion of the first nitride region 10 and opposes the second nitride region 20. The third electrode 53 is, for example, a recessed gate electrode. For example, the two-dimensional electron gas 10E under the second nitride region 20 is divided by the third electrode 53 and the first insulating film 41 (the gate insulating film). Thereby, the threshold voltage can be high; and a normally-off characteristic is obtained stably and easily.

An example of a method for manufacturing the semiconductor device 110 according to the embodiment will now be described.

FIG. 5A to FIG. 5D and FIG. 6A to FIG. 6D are schematic cross-sectional views in order of the processes, illustrating the method for manufacturing the semiconductor device according to the embodiment.

The buffer layer 17 is not illustrated in these drawings.

Figure 5A:
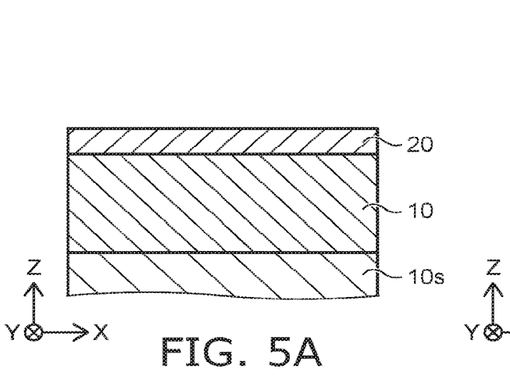
FIG. 5A to FIG. 5D are schematic cross-sectional views in order of the processes, illustrating the method for manufacturing the semiconductor device according to the embodiment.

As shown in FIG. 5A, the first nitride region 10 is provided on the base body 10s. The second nitride region 20 is provided on the first nitride region 10. The base body 10s is, for example, a silicon substrate.

Figure 5B:
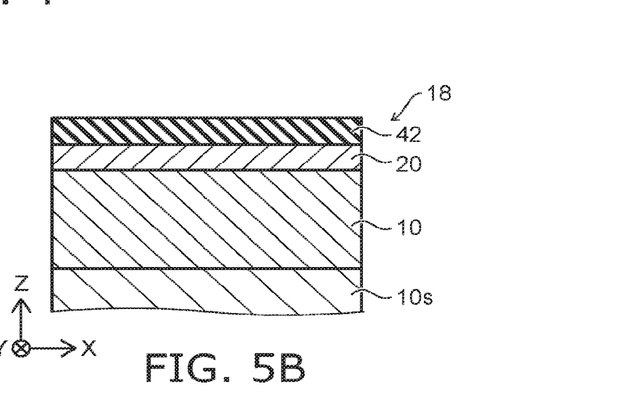

As shown in FIG. 5B, the second insulating film 42 is provided on the second nitride region 20. The stacked body 18 is obtained.

Figure 5C:
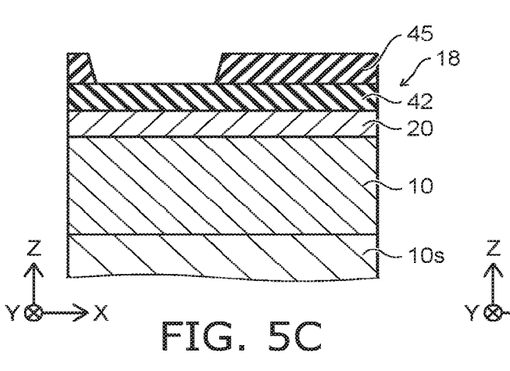

As shown in FIG. 5C, a mask film 45 that has a prescribed opening is formed on the second insulating film 42.

Figure 5D:
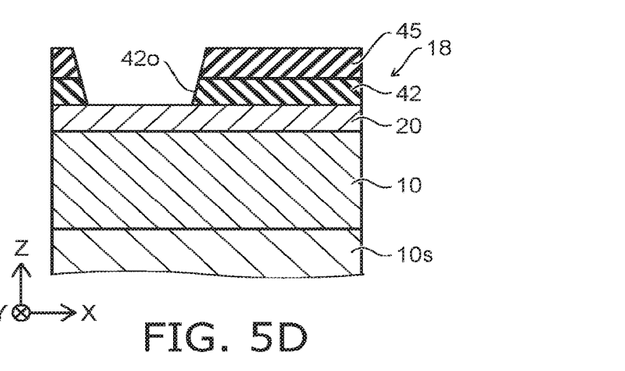

As shown in FIG. 5D, a portion of the second insulating film 42 is removed using the mask film 45 as a mask. Thereby, an opening 42o is formed in the second insulating film 42.

Figure 6A:
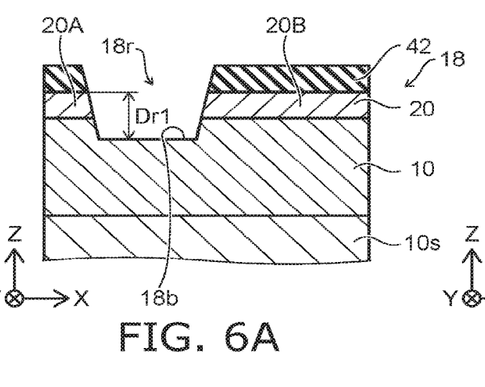
FIG. 6A to FIG. 6D are schematic cross-sectional views in order of the processes, illustrating the method for manufacturing the semiconductor device according to the embodiment

As shown in FIG. 6A, a portion of the stacked body 18 is removed using the second insulating film 42 as a mask. A recess 18r is formed in the stacked body 18. A portion of the first nitride region 10 is exposed at a bottom portion 18b of the recess 18r.

At this time, the recess depth Dr1 corresponds to the distance in the Z-axis direction between the bottom portion 18b and the upper surface of the second nitride region 20. For example, it is favorable for the recess depth Dr1 to be not less than 3 times the thickness (the length t2) of the second nitride region 20.

Figure 6B:
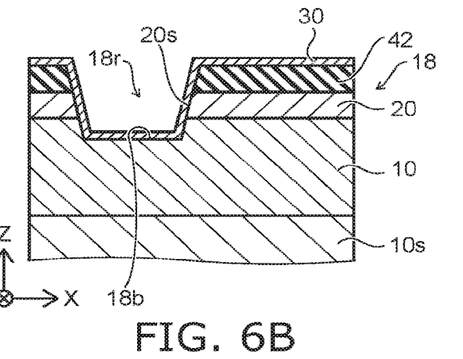

The third nitride region 30 is formed as shown in FIG. 6B. The third nitride region 30 is formed on the first nitride region 10 exposed at the bottom portion 18b of the recess 18r, a side surface 20s of the second nitride region 20, and the upper surface of the second insulating film 42.

Figure 6C:
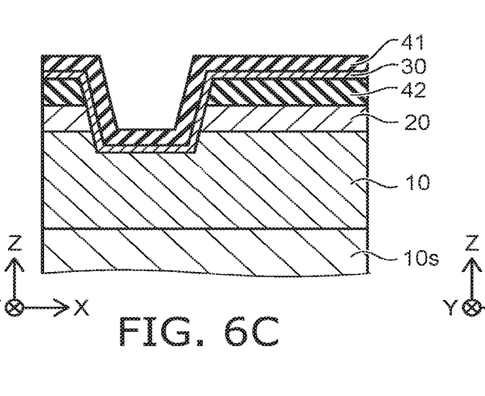

The first insulating film 41 is formed as shown in FIG. 6C.

Figure 6D:
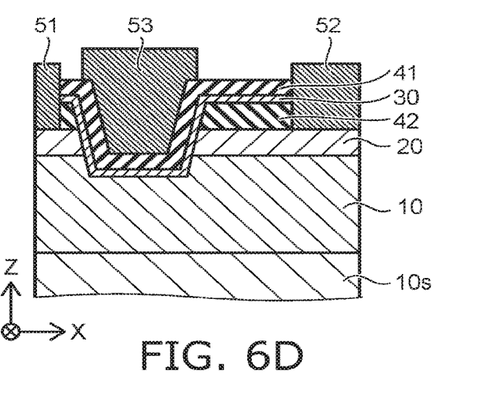

The first to third electrodes 51 to 53 are formed as shown in FIG. 6D. The second direction (the X-axis direction) from the first electrode 51 toward the second electrode 52 crosses the first direction (the Z-axis direction) from the first nitride region 10 toward the second nitride region 20. The position in the second direction of the third electrode 53 is between the position in the second direction of the first electrode 51 and the position in the second direction of the second electrode 52. At least a portion of the third electrode 53 is in the remaining space of the recess 18r. The third electrode 53 may oppose the first nitride region 10 in the second direction (the X-axis direction).

In the manufacturing method recited above, the third nitride region 30 is formed on the first nitride region 10 exposed at the bottom portion 18b of the recess 18r, the side surface 20s of the second nitride region 20, and the upper surface of the first insulating film 41. Good crystallinity of the first portion p1 of the third nitride region 30 (referring to FIG. 1A) is obtained. By forming the recess 18r by using the second insulating film 42, the damage of the second nitride region 20 is low. The third nitride region 30 is protected by forming the first insulating film 41 to cover the third nitride region 30.

Thus, the stacked body 18 is prepared in the manufacturing method recited above. The stacked body 18 includes the first nitride region 10 including $Al_{x1}Ga_{1-x1}N$ ($0 \leq x1 < 1$), the second nitride region 20 including $Al_{x2}Ga_{1-x2}N$ ($0 < x2 \leq 1$ and $x1 < x2$), and the second insulating film 42. The second nitride region 20 is provided between the first nitride region 10 and the second insulating film 42.

A recess is formed in the stacked body 18 by removing a portion of the stacked body 18 from the second insulating film 42 side. Then, a portion of the first nitride region 10 is exposed at the bottom portion of the recess.

The third nitride region 30 which includes $Al_{x3}Ga_{1-x3}N$ ($0 < x3 \leq 1$ and $x1 < x3$) is formed. The third nitride region 30 is formed on the first nitride region 10 exposed at the bottom portion of the recess, the side surface of the second nitride region 20, and the second insulating film 42.

The first insulating film 41 is formed after forming the third nitride region 30. The electrodes (the first to third electrodes 51 to 53) are formed. For example, the electrodes are formed after forming the first insulating film 41.

The embodiments may include the following configurations (e.g., technological proposals).

Configuration 1

A semiconductor device, comprising:
a first electrode;
a second electrode;
a first nitride region including $Al_{x1}Ga_{1-x1}N$ ($0 \leq x1 < 1$), the first nitride region including a first partial region, a second partial region, a third partial region between the first partial region and the second partial region, a fourth partial region between the first partial region and the third partial region, and a fifth partial region between the third partial region and the second partial region, a first direction from the first partial region toward the first electrode crossing a second direction from the first electrode toward the second electrode, a direction from the second partial region toward the second electrode being aligned with the first direction;
a second nitride region including $Al_{x2}Ga_{1-x2}N$ ($0 < x2 \leq 1$ and $x1 < x2$), the second nitride region including a sixth partial region and a seventh partial region, a direction from the fourth partial region toward the sixth partial region being aligned with the first direction, a direction from the fifth partial region toward the seventh partial region being aligned with the first direction;
a third electrode, a direction from the third partial region toward the third electrode being aligned with the first direction, at least a portion of the third electrode being between the sixth partial region and the seventh partial region in the second direction; and
a first insulating film including a first insulating region, the first insulating region being between the third partial region and the third electrode in the first direction,
the third partial region having a first surface opposing the first insulating region,
the fourth partial region having a second surface opposing the sixth partial region,
a ratio of a distance along the first direction between a position along the first direction of the first surface and a position along the first direction of the second surface to a length along the first direction of the sixth partial region being 2 or more,
a stacked region including the third partial region and the first insulating region and including a first position and a second position, the first position being between the second position and the third electrode in the first direction,
a concentration of Na in the stacked region having a peak at the first position,
a concentration of Na at the second position being 1/100 of a concentration of Na at the first position, a first distance along the first direction between the first position and the second position being 8 nm or less.

Configuration 2

The semiconductor device according to Configuration 1, wherein the first distance is 5 nm or less.

Configuration 3

The semiconductor device according to Configuration 1 or 2, wherein the ratio is 3 or more.

Configuration 4

The semiconductor device according to Configuration 1 or 2, wherein the ratio is 3.5 or more.

Configuration 5

The semiconductor device according to any one of Configurations 1 to 4, further comprising a third nitride region including $Al_{x3}Ga_{1-x3}N$ (0<x3≤1 and x1<x3),
the third nitride region including first to seventh portions, the first portion being between the first insulating region and the third partial region, the second portion being between the third electrode and the fourth partial region, the third portion being between the third electrode and the fifth partial region, the fourth portion being between the third electrode and the sixth partial region, the fifth portion being between the third electrode and the seventh partial region, the sixth partial region being between the sixth portion and the fourth partial region, the seventh partial region being between the seventh portion and the fifth partial region.

Configuration 6

The semiconductor device according to Configuration 5, further comprising a second insulating film including a second insulating region and a third insulating region,
the sixth partial region being between the fourth partial region and the second insulating region,
the seventh partial region being between the fifth partial region and the third insulating region.

Configuration 7

The semiconductor device according to Configuration 6, wherein
the first insulating film further includes fourth to seventh insulating regions,
the fourth insulating region is between the fourth portion and the third electrode,
the fifth insulating region is between the fifth portion and the third electrode,
the sixth portion is between the sixth insulating region and the second insulating region, and
the seventh portion is between the seventh insulating region and the third insulating region.

Configuration 8

The semiconductor device according to Configuration 7, wherein
the first insulating film further includes an eighth insulating region and a ninth insulating region,
the eighth insulating region is between the second portion and the third electrode, and
the ninth insulating region is between the third portion and the third electrode.

Configuration 9

The semiconductor device according to any one of Configurations 6 to 8, wherein
the first insulating film includes Na, silicon and oxygen, and
the second insulating film includes silicon and nitrogen.

Configuration 10

The semiconductor device according to any one of Configurations 6 to 9, wherein a crystallinity of the first portion is higher than a crystallinity of the sixth portion.

Configuration 11

The semiconductor device according to any one of Configurations 6 to 10, wherein
at least a portion of the first portion includes a crystal, and
at least a portion of the sixth portion is amorphous.

Configuration 12

The semiconductor device according to any one of Configurations 6 to 11, wherein a crystallinity of the second portion is higher than a crystallinity of the sixth portion.

Configuration 13

The semiconductor device according to any one of Configurations 6 to 12, wherein a crystallinity of the fourth portion is higher than a crystallinity of the sixth portion.

Configuration 14

The semiconductor device according to any one of Configurations 6 to 13, wherein
the first insulating film does not include nitrogen, or
a concentration of nitrogen included in the first insulating film is lower than a concentration of nitrogen included in the second insulating film.

Configuration 15

The semiconductor device according to any one of Configurations 5 to 14, wherein x3 is higher than x2.

Configuration 16

The semiconductor device according to any one of Configurations 5 to 15, wherein
x1 is not less than 0 and not more than 0.05,
x2 is not less than 0.1 and not more than 0.3, and
x3 is not less than 0.8 and not more than 1.

According to the embodiments, a semiconductor device can be provided in which the characteristics can be improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as nitride regions, electrodes, insulating layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode;
   a first nitride region including $Al_{x1}Ga_{1-x1}N$ (0≤x1<1), the first nitride region including a first partial region, a second partial region, a third partial region between the first partial region and the second partial region, a fourth partial region between the first partial region and the third partial region, and a fifth partial region between the third partial region and the second partial region, a first direction from the first partial region toward the first electrode crossing a second direction from the first electrode toward the second electrode, a third direction from the second partial region toward the second electrode being aligned with the first direction;
   a second nitride region including $Al_{x2}Ga_{1-x2}N$ (0<x2≤1 and x1<x2), the second nitride region including a sixth partial region and a seventh partial region, a fourth direction from the fourth partial region toward the sixth partial region being aligned with the first direction, a fifth direction from the fifth partial region toward the seventh partial region being aligned with the first direction;
   a third electrode, a sixth direction from the third partial region toward the third electrode being aligned with the first direction, at least a portion of the third electrode being between the sixth partial region and the seventh partial region in the second direction; and
   a first insulating film including a first insulating region, the first insulating region being between the third partial region and the third electrode in the first direction,
   the third partial region having a first surface opposing the first insulating region,
   the fourth partial region having a second surface opposing the sixth partial region,
   a ratio of a distance along the first direction between a position along the first direction of the first surface and a position along the first direction of the second surface to a length along the first direction of the sixth partial region being 2 or more,
   a stacked region including the third partial region and the first insulating region and including a first position and a second position, the first position being between the second position and the third electrode in the first direction,
   a first concentration of Na in the stacked region having a peak at the first position,
   a second concentration of Na at the second position being $\frac{1}{100}$ of the first concentration of Na at the first position,
   a first distance along the first direction between the first position and the second position being 8 nm or less.

2. The device according to claim 1, wherein the first distance is 5 nm or less.

3. The device according to claim 1, wherein the ratio is 3 or more.

4. The device according to claim 1, wherein the ratio is 3.5 or more.

5. The device according to claim 1, further comprising a third nitride region including $Al_{x3}Ga_{1-x3}N$ (0<x3≤1 and x1<x3),
   the third nitride region including first to seventh portions, the first portion being between the first insulating region and the third partial region, the second portion being between the third electrode and the fourth partial region, the third portion being between the third electrode and the fifth partial region, the fourth portion being between the third electrode and the sixth partial region, the fifth portion being between the third electrode and the seventh partial region, the sixth partial region being between the sixth portion and the fourth partial region, the seventh partial region being between the seventh portion and the fifth partial region.

6. The device according to claim 5, further comprising a second insulating film including a second insulating region and a third insulating region,
   the sixth partial region being between the fourth partial region and the second insulating region,
   the seventh partial region being between the fifth partial region and the third insulating region.

7. The device according to claim 6, wherein
   the first insulating film further includes fourth to seventh insulating regions,
   the fourth insulating region is between the fourth portion and the third electrode,
   the fifth insulating region is between the fifth portion and the third electrode,
   the sixth portion is between the sixth insulating region and the second insulating region, and
   the seventh portion is between the seventh insulating region and the third insulating region.

8. The device according to claim 7, wherein
   the first insulating film further includes an eighth insulating region and a ninth insulating region, the eighth insulating region is between the second portion and the third electrode, and the ninth insulating region is between the third portion and the third electrode.

9. The device according to claim 6, wherein the first insulating film includes Na, silicon and oxygen, and the second insulating film includes silicon and nitrogen.

10. The device according to claim 6, wherein a crystallinity of the first portion is higher than a crystallinity of the sixth portion.

11. The device according to claim 6, wherein at least a portion of the first portion includes a crystal, and at least a portion of the sixth portion is amorphous.

12. The device according to claim 6, wherein a crystallinity of the second portion is higher than a crystallinity of the sixth portion.

13. The device according to claim 6, wherein a crystallinity of the fourth portion is higher than a crystallinity of the sixth portion.

14. The device according to claim 6, wherein the first insulating film does not include nitrogen, or a concentration of nitrogen included in the first insulating film is lower than a concentration of nitrogen included in the second insulating film.

15. The device according to claim 5, wherein x3 is higher than x2.

16. The device according to claim 5, wherein x1 is not less than 0 and not more than 0.05, x2 is not less than 0.1 and not more than 0.3, and x3 is not less than 0.8 and not more than 1.

* * * * *